United States Patent
Wang et al.

(10) Patent No.: US 8,067,280 B2
(45) Date of Patent: Nov. 29, 2011

(54) HIGH PERFORMANCE CMOS DEVICES AND METHODS FOR MAKING SAME

(75) Inventors: Chih-Hao Wang, Hsinchu (TW); Ta-Wei Wang, Taipei (TW); Chenming Hu, Almo, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/191,868

(22) Filed: Aug. 14, 2008

(65) Prior Publication Data

US 2008/0305590 A1   Dec. 11, 2008

Related U.S. Application Data

(62) Division of application No. 10/999,724, filed on Nov. 30, 2004, now abandoned.

(51) Int. Cl.
*H01L 21/00* (2006.01)
(52) U.S. Cl. .................... 438/217; 438/305; 438/213
(58) Field of Classification Search .............. 438/217, 438/213, 305
See application file for complete search history.

(56) References Cited

U.S. PATENT DOCUMENTS

| | | | |
|---|---|---|---|
| 5,006,477 A | 4/1991 | Farb | |
| 5,349,225 A | 9/1994 | Redwine et al. | |
| 5,352,914 A | 10/1994 | Farb | |
| 5,654,569 A | 8/1997 | Ko | |
| 5,864,162 A * | 1/1999 | Reedy et al. | 257/379 |
| 5,930,642 A * | 7/1999 | Moore et al. | 438/407 |
| 6,008,099 A * | 12/1999 | Sultan et al. | 438/305 |
| 6,187,643 B1 * | 2/2001 | Borland | 438/302 |
| 6,362,063 B1 * | 3/2002 | Maszara et al. | 438/307 |
| 6,399,450 B1 * | 6/2002 | Yu | 438/300 |
| 6,399,452 B1 * | 6/2002 | Krishnan et al. | 438/305 |
| 6,455,383 B1 | 9/2002 | Wu | |
| 6,455,388 B1 | 9/2002 | Lai et al. | |
| 6,472,282 B1 * | 10/2002 | Yu | 438/305 |
| 6,492,670 B1 | 12/2002 | Yu | |
| 6,506,650 B1 * | 1/2003 | Yu | 438/301 |
| 6,521,502 B1 * | 2/2003 | Yu | 438/305 |
| 6,521,963 B1 | 2/2003 | Ota et al. | |
| 6,630,386 B1 * | 10/2003 | Yu | 438/305 |
| 6,660,605 B1 | 12/2003 | Liu | |
| 6,743,689 B1 * | 6/2004 | Paton et al. | 438/305 |
| 6,943,085 B2 * | 9/2005 | Wang et al. | 438/305 |
| 6,960,512 B2 | 11/2005 | Cheng et al. | |

(Continued)

OTHER PUBLICATIONS

Office Action dated May 14, 2008 issued in parent U.S. Appl. No. 10/999,724, filed Nov. 30, 2004 of Chih-Hao Wan.

(Continued)

*Primary Examiner* — Laura Menz
(74) *Attorney, Agent, or Firm* — Duane Morris LLP; Won Joon Kouh

(57) ABSTRACT

An integrated circuit having high performance CMOS devices with good short channel effects may be made by forming a gate structure over a substrate; forming pocket implant regions and source/drain extensions in the substrate; forming spacers along sides of the gate structure; and thermal annealing the substrate when forming the spacers, the thermal annealing performed at an ultra-low temperature. An integrated circuit having high performance CMOS devices with low parasitic junction capacitance may be made by forming a gate structure over a substrate; forming pocket implant regions and source/drain extensions in the substrate; forming spacers along sides of the gate structure; performing a low dosage source/drain implant; and performing a high dosage source/drain implant.

6 Claims, 10 Drawing Sheets

U.S. PATENT DOCUMENTS

| | | | |
|---|---|---|---|
| 7,078,284 B2 | 7/2006 | Trivedi | |
| 7,101,743 B2* | 9/2006 | Li et al. | 438/197 |
| 7,138,322 B2* | 11/2006 | Noda | 438/519 |
| 7,169,675 B2* | 1/2007 | Tan et al. | 438/301 |
| 7,211,516 B2* | 5/2007 | Chen et al | 438/682 |
| 7,344,985 B2* | 3/2008 | Chen et al. | 438/682 |
| 7,355,255 B2* | 4/2008 | Chen et al. | 257/388 |
| 7,511,350 B2* | 3/2009 | Chen et al. | 257/412 |
| 7,531,436 B2* | 5/2009 | Kohli | 438/528 |
| 2004/0115889 A1* | 6/2004 | Jain et al. | 438/301 |
| 2004/0173843 A1* | 9/2004 | Noda | 257/327 |
| 2005/0112830 A1* | 5/2005 | Jain et al. | 438/301 |
| 2005/0148125 A1* | 7/2005 | Li et al. | 438/197 |
| 2006/0006427 A1* | 1/2006 | Tan et al. | 257/227 |
| 2006/0113591 A1* | 6/2006 | Wan et al. | 257/335 |
| 2006/0183302 A1* | 8/2006 | Kohli | 438/486 |
| 2006/0223295 A1* | 10/2006 | Chen et al. | 438/592 |
| 2006/0292762 A1* | 12/2006 | Borland et al. | 438/151 |
| 2007/0049022 A1* | 3/2007 | Chen et al. | 438/682 |
| 2007/0117326 A1* | 5/2007 | Tan et al. | 438/266 |
| 2007/0141840 A1* | 6/2007 | Chen et al. | 438/682 |
| 2007/0267660 A1* | 11/2007 | Surdeanu | 257/213 |
| 2008/0128837 A1* | 6/2008 | Chen et al. | 257/412 |
| 2008/0286929 A1* | 11/2008 | Miyashita | 438/278 |
| 2008/0305590 A1* | 12/2008 | Wang et al. | 438/217 |
| 2009/0057678 A1* | 3/2009 | Goldbach et al. | 257/66 |
| 2009/0093095 A1* | 4/2009 | Obradovic et al. | 438/231 |
| 2009/0224319 A1* | 9/2009 | Kohli | 257/344 |
| 2009/0272976 A1* | 11/2009 | Brunco et al. | 257/57 |

OTHER PUBLICATIONS

Office Action dated Nov. 1, 2007 issued in parent U.S. Appl. No. 10/999,724, filed Nov. 30, 2004 of Chih-Hao Wan.

Office Action dated May 29, 2007 issued in parent U.S. Appl. No. 10/999,724, filed on Nov. 30, 2004 of Chih-Hao Wan.

Office Action dated Jan. 19, 2007 issued in parent U.S. Appl. No. 10/999,724, filed Nov. 30, 2004 of Chih-Hao Wan.

Office Action dated Jun. 20, 2006 issued in parent U.S. Appl. No. 10/999,724, filed Nov. 30, 2004 of Chih-Hao Wan.

* cited by examiner

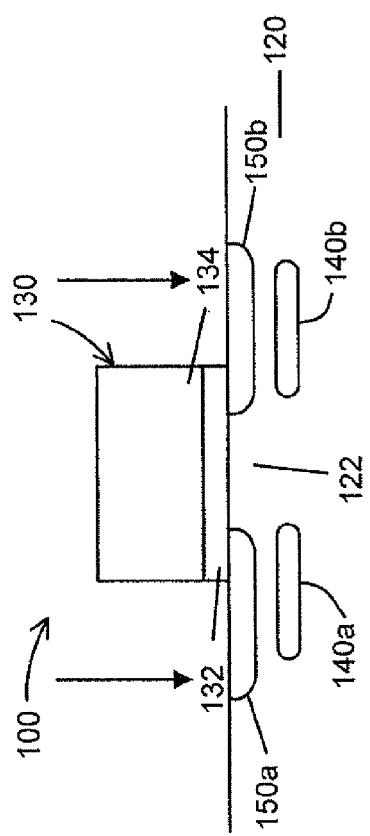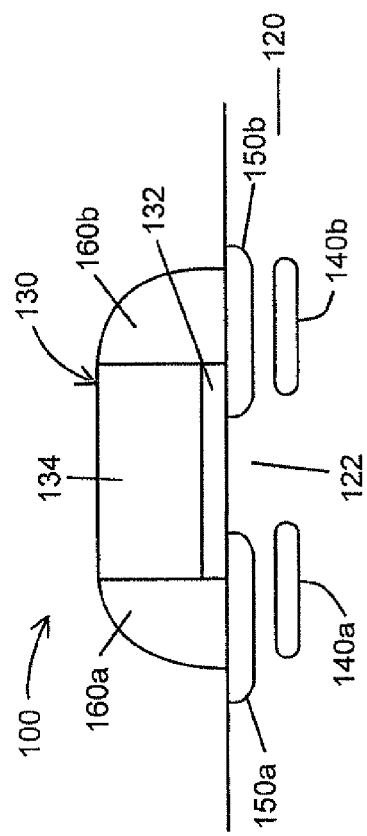

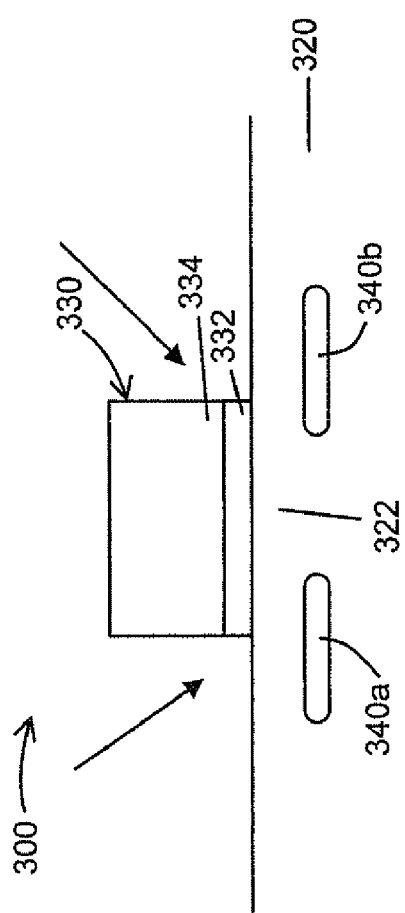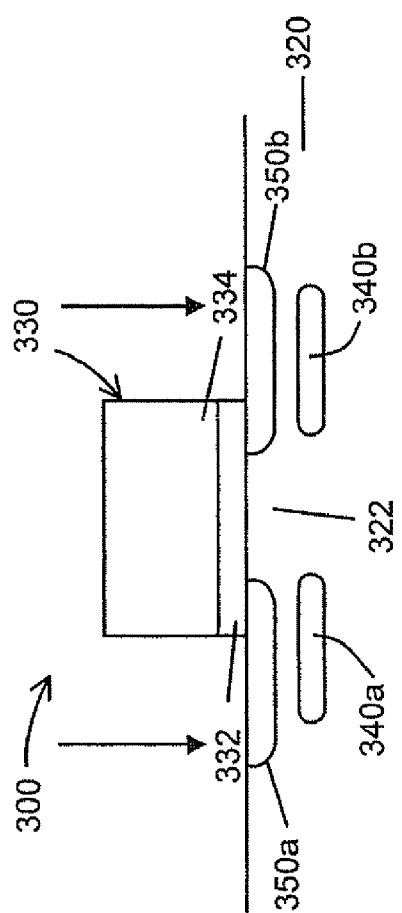

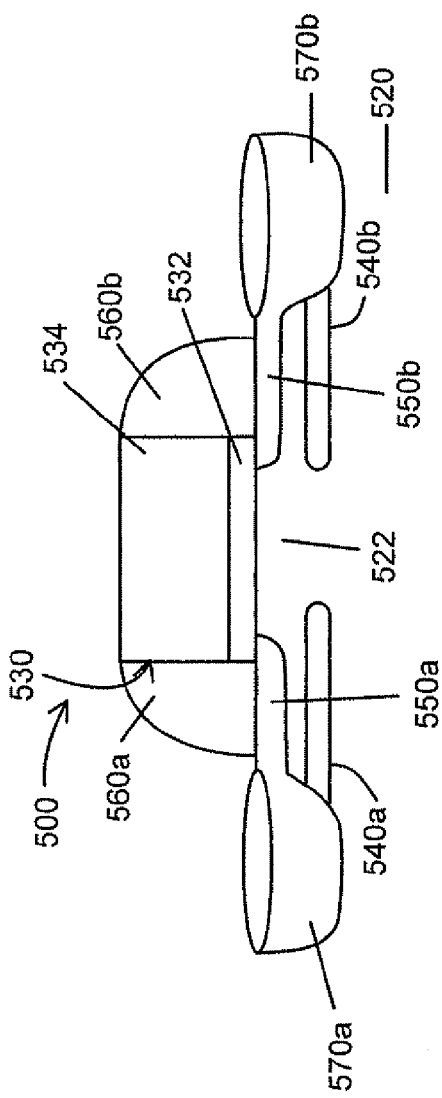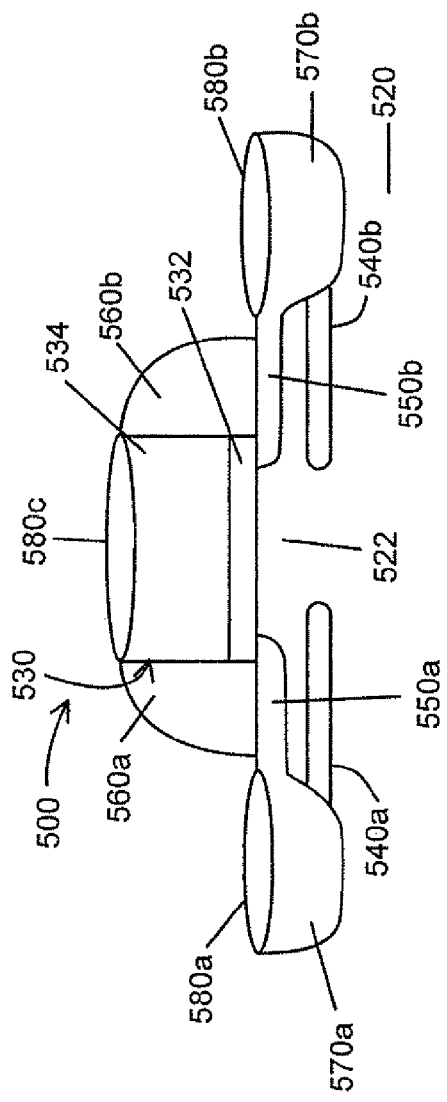

HIGH PERFORMANCE CMOS DEVICES AND METHODS FOR MAKING SAME

RELATED APPLICATION

This application is a division of U.S. application Ser. No. 10/999,724, filed Nov. 30, 2004. The entire disclosure of U.S. application Ser. No. 10/999,724 is incorporated herein by reference.

FIELD OF INVENTION

The present invention relates to integrated circuits and high performance complementary metal oxide semiconductor (CMOS) devices and more particularly, to integrated circuits having high performance CMOS devices with good short channel effects, low parasitic junction capacitances, and low junction leakage currents and methods for making same.

BACKGROUND OF THE INVENTION

High performance CMOS devices should have, among other characteristics, good short channel behavior, low parasitic junction capacitances and low junction leakage currents. However, as the size of integrated circuits (ICs) continues to shrink and the number of high performance CMOS devices on IC chips continue to increase, the dimensions of the CMOS devices must be scaled down. The scaling down of CMOS devices makes it difficult to achieve good short channel effects, low parasitic junction capacitances and low junction leakage currents.

Accordingly, methods are needed for manufacturing smaller ICs with scaled down high performance CMOS devices.

SUMMARY OF THE INVENTION

Integrated circuits having high performance CMOS devices with good short channel effects, low parasitic junction capacitances, and low junction leakage currents and methods for making same are disclosed. One of the methods comprises the steps of: forming a gate structure over a substrate; forming pocket implant regions and source/drain extensions in the substrate; forming spacers along sides of the gate structure; and thermal annealing the substrate when forming the spacers, the thermal annealing performed at an ultra-low temperature.

Another one of the methods comprises the steps of: forming a gate structure over a substrate; forming source/drain extensions in the substrate; and performing a thermal cycle process for solid phase epitaxy on the substrate.

Still another one of the methods comprises the steps of: forming a gate structure over a substrate; forming pocket implant regions in the substrate; forming thin, off-set spacers along sides of the gate structure; and forming source/drain extensions in the substrate.

A further one of the methods comprises the steps of: forming a gate structure over a substrate; forming pocket implant regions and source/drain extensions in the substrate; forming spacers along sides of the gate structure; performing a low dosage source/drain implant; and performing a high dosage source/drain implant.

One of the integrated circuits comprises: a gate structure over a substrate; pocket implant regions and source/drain extensions in the substrate; and spacers disposed along sides of the gate structure, the spacers formed while thermal annealing the substrate at an ultra-low temperature.

Another one of the integrated circuits comprises: a gate structure over a substrate; pocket implant regions and source/drain extensions in the substrate; graded source/drain regions in the substrate, the graded source/drain regions formed by a low dosage source/drain implant and a high dosage source/drain implant.

Still another one of the integrated circuits comprises: a gate structure over a substrate; a super halo-shape pocket implant region in the substrate; thin, off-set spacers disposed along sides of the gate structure; and source/drain extensions in the substrate.

BRIEF DESCRIPTION OF THE DRAWINGS

FIGS. 1A-1E are sectional views illustrating a method of fabricating a scaled down transistor of a high performance CMOS device according to the present invention.

FIGS. 3A-3C are sectional views illustrating an alternate method of fabricating a scaled down transistor of a high performance CMOS device according to the present invention.

FIGS. 5A-5E are sectional views illustrating yet another method of fabricating a scaled down transistor of a high performance CMOS device according to the present invention.

DETAILED DESCRIPTION OF THE INVENTION

Figure 1A:
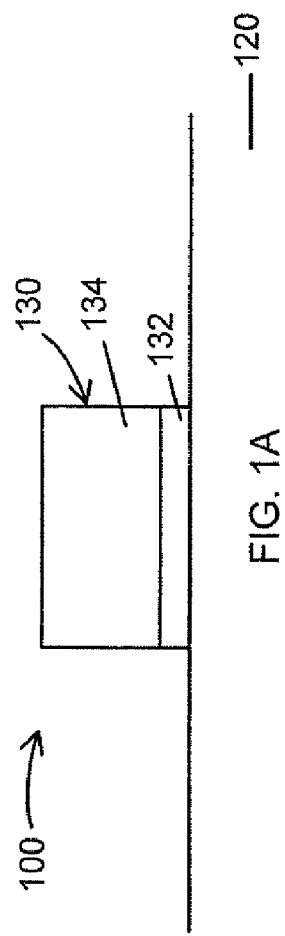

FIGS. 1A-1E are sectional views illustrating a method of fabricating a scaled down transistor 100 (e.g. PMOS or NMOS) of a high performance CMOS device according to the present invention. As illustrated in FIG. 1A, the method commences with the formation of a gate structure 130 over a substrate 120. The substrate 120 is not limited to a particular type and may be include, without limitation, an element semiconductor, such as Si and Ge, or a compound semiconductor, such as GaAs, InGaAs and ZnSe. The gate structure 130 may include a gate oxide 132, such as $SiO_2$, disposed over the substrate 120 and a gate conductor 134, such as poly-Si, poly SiGe, a metal, a metal oxide, a metal nitride, a silicide and combinations thereof, disposed over the gate oxide 132. The gate structure 130 may be formed using conventional methods well known in the art.

Figure 1B:
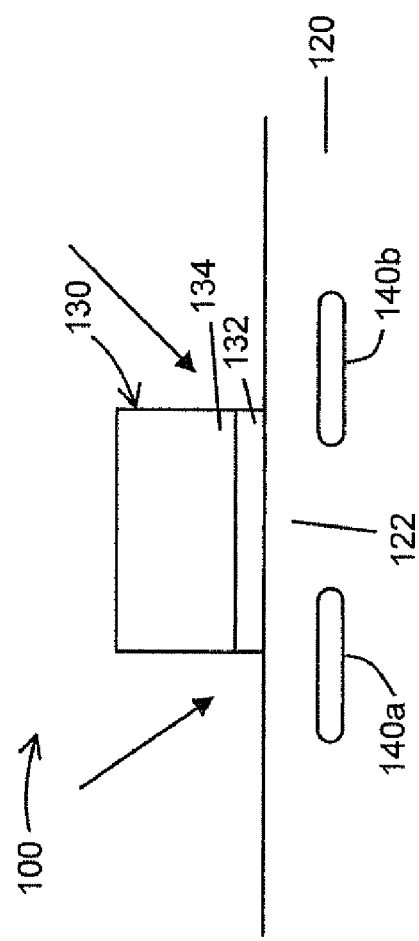

As illustrated in FIG. 1B, a self-aligning pocket ion implantation process is performed to form self-aligned first and second pocket implant regions 140a, 140b in the substrate 120 at opposite ends of channel region 122. The pocket implantation process may be performed with an ion beam tilt-angle (as shown) or without an ion beam tilt-angle. When tilt-ion implantation is used, the ion beam tilt-angle may up to about 50 degrees. The pocket implantation process is performed with a implant current (dosage) that is typically less than 2E15 cm−2 and an implant voltage (energy) that is typically less than 200 kev. The dopant used may include, for example, As, P, $BF_2$, In Sb, and B.

As illustrated in FIG. 1C, a self-aligning source/drain extension ion implantation process is performed to form shallow source/drain extensions 150a, 150b in the substrate 120. The shallow source/drain extensions 150a, 150b may extend partially beneath the gate oxide 132 and above the pocket implant regions 140a, 140b. The source/drain extension implantation process may be performed with or without an ion beam tilt-angle. When tilt-ion implantation is used, the ion beam tilt-angle may be up to about 50 degrees. The source/drain extension implantation process is performed with an implant dosage that is typically less than 2E16 cm−2 and an implant energy that is typically less than 200 kev. The dopant used may include, for example, As, P, $BF_2$, In, Sb, and B.

As illustrated in FIG. 1D, an ultra low temperature thermal cycle spacer deposition (UL-DT spacer) process is performed to form first and second non-conductive spacers 160a, 160b along opposing side walls of the gate structure 130. The spacers 160a, 160b may be formed as single or multilayer structure. The single layer spacers may be composed, for example, of an oxide layer or a nitride layer. Multilayer spacers may be a composite composed for example, of an oxide layer and a nitride layer or a first oxide layer, a nitride layer, and a second oxide layer. The layer or layers of the spacers may be formed using low pressure chemical vapor deposition and dry plasma etching. In one embodiment, the UL-DT spacer process is performed by thermal annealing the substrate 120 using an ultra-low temperature cycle to activate the dopants forming the pocket implant regions 140a, 140b and source/drain extensions 150a, 150b and then performing a conventional spacer deposition process. The thermal annealing may be performed using RTA or a furnace anneal at an ultra-low temperature between about 350° C. and about 800° C., for a time period ranging between about 5 seconds and about 700 minutes.

In an alternative embodiment, the UL-DT spacer process is performed in a single step, i.e., during spacer deposition, which operates to thermally anneal the substrate 120 at an ultra-low temperature between about 350° C. and about 800° C., for a time period ranging between about 5 seconds and about 700 minutes.

Figure 1E:
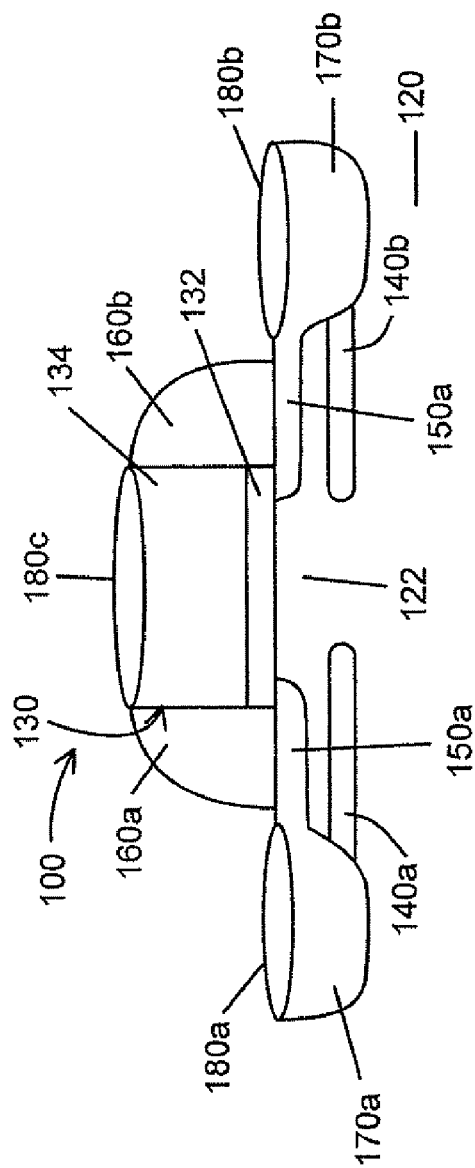

As illustrated in FIG. 1E, the transistor 100 may be completed by forming self-aligned source/drain regions 170a, 170b in the substrate 120 which contact the source/drain extensions 150a, 150b, and forming conductive silicide films 180a, 180b, 180c over the gate conductor 134 and the source/drain regions 170a, 170b. The source/drain regions 170a, 170b may be formed using conventional source/drain implantation and anneal processes. The silicide films 180a, 180b, 180c may be formed using a conventional silicidation process.

Figure 2A:
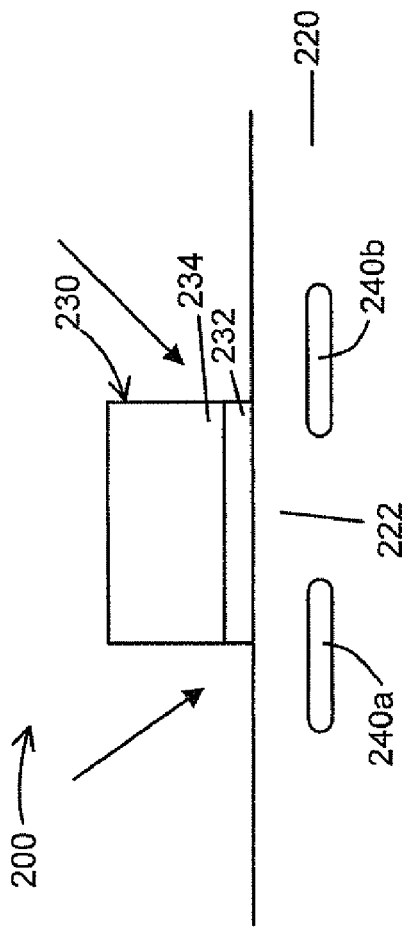
FIGS. 2A-2C are sectional views illustrating an alternate method of fabricating a scaled down transistor of a high performance CMOS device according to the present invention.
Figure 2B:
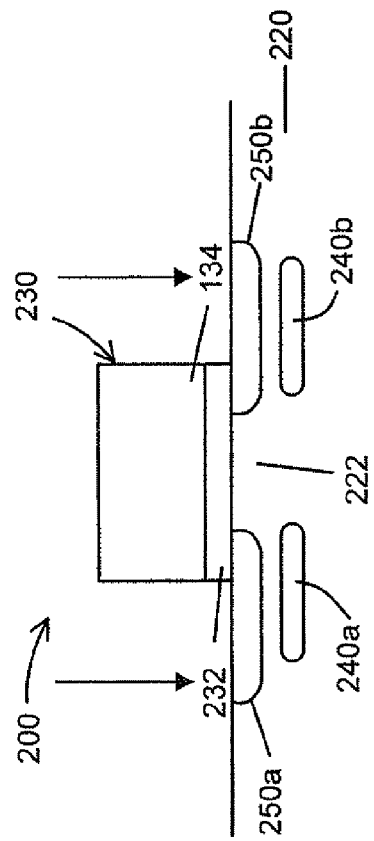
Figure 2C:
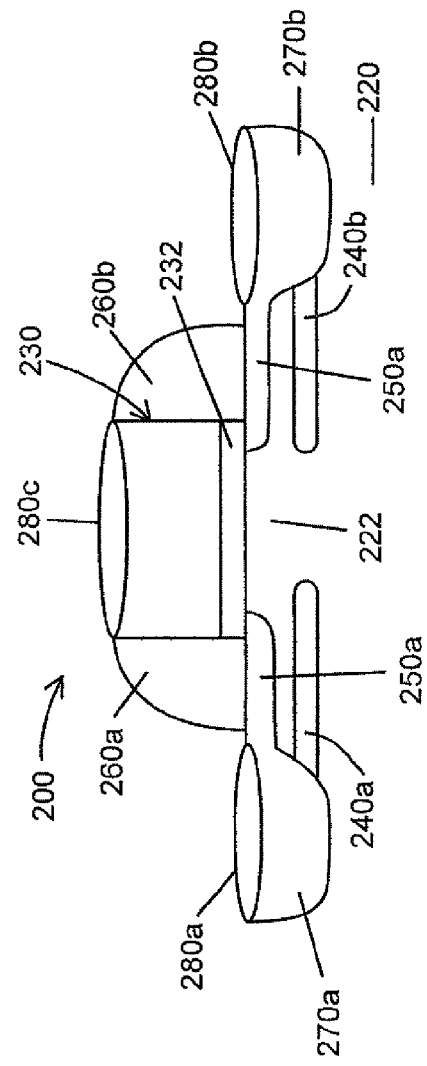

FIGS. 2A-2C are sectional views illustrating an alternate method of fabricating a scaled down transistor 200 (e.g. PMOS or NMOS) of a high performance CMOS device according to the present invention. The method starts with a substrate 220 similar to the one described above with reference to FIG. 1A. Then, as illustrated in FIG. 2A, a self-aligning pocket ion implantation process is performed to form regions 240a, 240b in the substrate 220. The pocket implantation process may be performed in the same manner as described earlier, i.e., with an ion beam tilt angle that may be up to 50 degrees or without an ion beam tilt-angle. The pocket implantation process is performed with an implant dosage that is typically less than 2E15 cm−2 and an implant energy that is typically less than 200 kev. The dopant used may include, for example, As, P, $BF_2$, In, Sb, and B.

A self-aligning source/drain extension ion implantation process is performed, as illustrated in FIG. 2B, to form shallow source/drain extensions 250a, 250b in the substrate 220. The source/drain extension implantation process may be performed with a beam tilt angle up to about 50 degrees or without an ion beam tilt-angle. The source/drain extension implantation process is performed with an implant dosage that is typically less than 2E16 cm−2 and an implant energy that is typically less than 200 kev. The dopant used may include, for example, As, P, $BF_2$, In Sb, and B. A thermal anneal is then performed to activate the dopants forming the pocket implant regions 240a, 240b.

The substrate is then subjected to a low temperature thermal cycle process for solid phase epitaxy. The low temperature thermal cycle process activates the dopants forming the source/drain extensions 250a, 250b. The thermal anneal may be performed using RTA or a furnace anneal at an ultra-low temperature between about 350° C. and 800° C. for a time period ranging between about 5 seconds and about 700 minutes.

As illustrated in FIG. 2C, the transistor 200 may be completed by forming first and second non-conductive spacers 260a, 260b along opposing side walls of the gate structure 230, self-aligned first and second source/drain regions 270a, 270b in the substrate 220 which contact the source/drain extensions 250a, 250b, and forming conductive silicide films 280a, 280b, 280c over the gate conductor 234 and the source/drain regions 270a, 270b. The spacers 260a, 260b may be formed as single or multilayer structure using a conventional spacer forming method. The source/drain regions 270a, 270b may be formed using conventional source/drain implantation and anneal processes. The silicide films 280a, 280b, 280c may be formed using a conventional silicidation process.

Figure 3C:
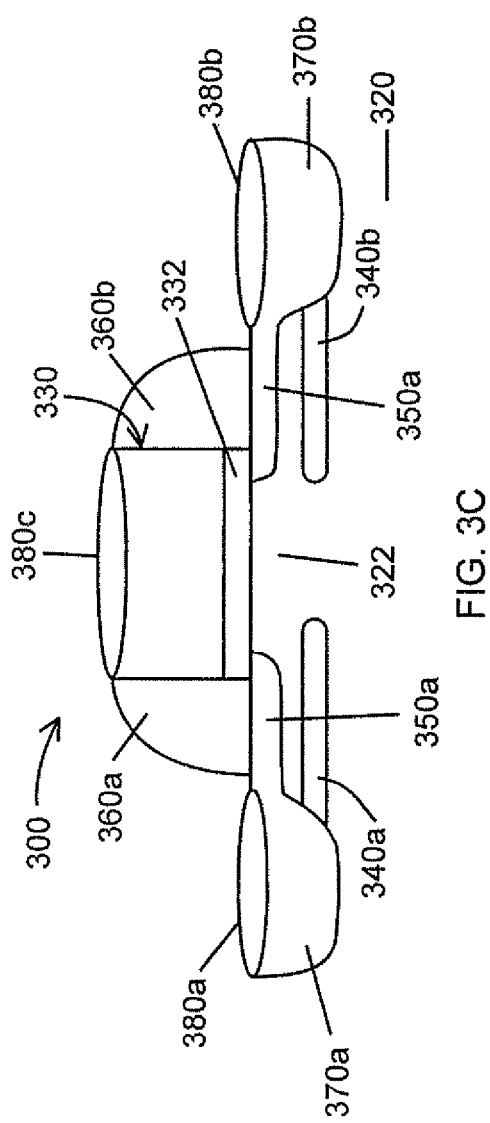

FIGS. 3A-3C are sectional views illustrating an alternate method of fabricating the scaled down transistor 200 of FIG. 2C. The method starts with a substrate 320 similar to the one described above with reference to FIG. 1A. Then, as illustrated in FIG. 3A, a self-aligning pocket ion implantation process is performed to form pocket implant regions 340a, 340b in the substrate 320. The pocket implantation process may be performed in the same manner as described earlier, i.e., with an ion beam tilt angle that may be up to 50 degrees or without an ion beam tilt-angle. The pocket implantation process is performed with an implant dosage that is typically less than 2E15 cm−2 and an implant energy that is typically less than 200 kev. The dopant used may include, for example, As, P, $BF_2$, In, Sb, and B.

A thermal anneal is then performed on the substrate 320. The temperature thermal anneal is performed at a range of about 700° C. to about 1050° C., for a time period of about 0 seconds to about 60 seconds to activate the pocket dopant.

A self-aligning source/drain extension ion implantation process is performed, as illustrated in FIG. 3B, to form shallow source/drain extensions 350a, 350b in the substrate 320. The source/drain extension implantation process may be performed with a beam tilt angle up to about 50 degrees or without an ion beam tilt-angle. The source/drain extension implantation process is performed with an implant dosage that is typically less than 2E16 cm−2 and an implant energy that is typically less than 200 kev. The dopant used may include, for example, As, P, $BF_2$, In Sb, and B.

The substrate 320 is then subjected to a low temperature thermal cycle process for solid phase epitaxy. The low temperature thermal cycle process activates the dopants forming the source/drain extensions 350a, 350b. The thermal anneal is performed at an ultra-low temperature between about 350° C. and 800° C., for a time period of between about 5 seconds to about 700 minutes.

As illustrated in FIG. 3C, the transistor 300 may be completed by forming first and second non-conductive spacers 360a, 360b along opposing side walls of the gate structure 330, self-aligned first and second source/drain regions 370a, 370b in the substrate 320 which contact the source/drain extensions 350a, 350b, and forming conductive silicide films 380a, 380b, 380c over the gate conductor 334 and the source/drain regions 370a, 370b. The spacers 360a, 360b may be formed as single or multilayer structure using a conventional spacer forming method. The source/drain regions 370a, 370b may be formed using conventional source/drain implantation and anneal processes. The silicide films 380a, 380b, 380c may be formed using a conventional silicidation process.

Figure 4A:
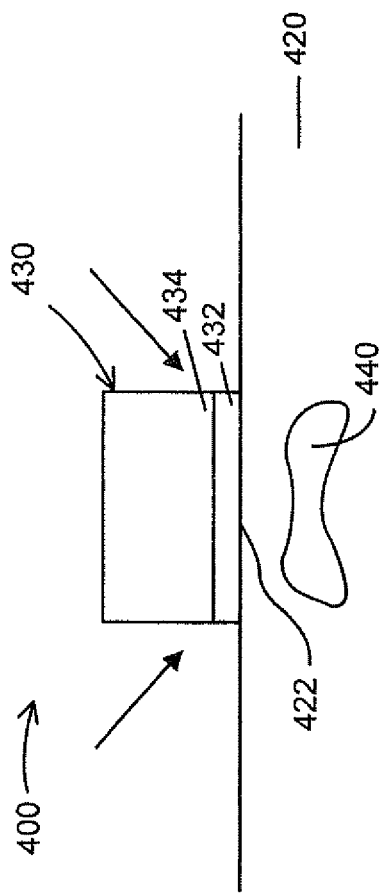
FIGS. 4A-4D are sectional views illustrating still another method of fabricating a scaled down transistor of a high performance CMOS device according to the present invention.

FIGS. 4A-4D are sectional views illustrating still another method of fabricating a scaled down transistor 400 (e.g. PMOS or NMOS) of a high performance CMOS device according to the present invention. The method starts with a substrate 420 similar to the one described above with reference to FIG. 1A. Then, as illustrated in FIG. 4A, a self-aligning super-halo pocket ion implantation process is performed to form a self-aligned super-halo shape pocket implant region 440 in the substrate 420, below the channel region 422. The super halo pocket ion implantation process may include a first step performed with a high implantation energy at a beam tilt angle of less than 20 degrees and a second step performed with a low implantation energy at a beam tilt angle of less than 40 degrees. The high implantation energy used in the first step is typically in the range of about 15 Kev to about 200 Kev with an implant dosage ranging between about 1E13 to about 5E14. The low implantation energy used in the second step is typically in the range of about 5 Kev to about 100 Kev with an implant dosage ranging between about 5E12 to about 3E14. The dopant used may include, for example, As, P, $BF_2$, In Sb, and B. This process confines the profile of the pocket region 440 to the bottom of the channel region 422.

Figure 4B:
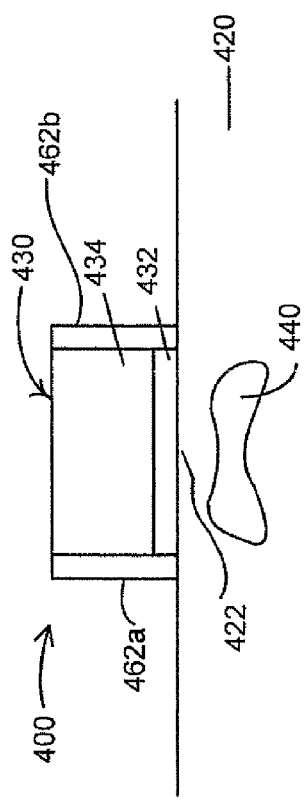

First and second non-conductive offset, thin-width spacers 462a, 462b are then formed along opposing side walls of the gate structure 430, as illustrated in FIG. 4B using a low temperature thermal cycle spacer deposition process. The thin width offset spacers 462a, 462b may be formed as single or multilayer structure and may have a width ranging between about 10 angstroms and 300 angstroms. Single layer spacers may be composed, for example, of an oxide layer or a nitride layer and multilayer spacers may be a composite composed for example, of an oxide layer and a nitride layer or a first oxide layer, a nitride layer, and a second oxide layer. The layer or layers of the spacers 462a, 462b may be formed using low pressure chemical vapor deposition and dry plasma etching. The temperature for performing both the deposition and the etching processes may range between about 600° C. and about 700° C. The time for depositing all the layers of the spacers may be less than 2 hours.

Figure 4C:
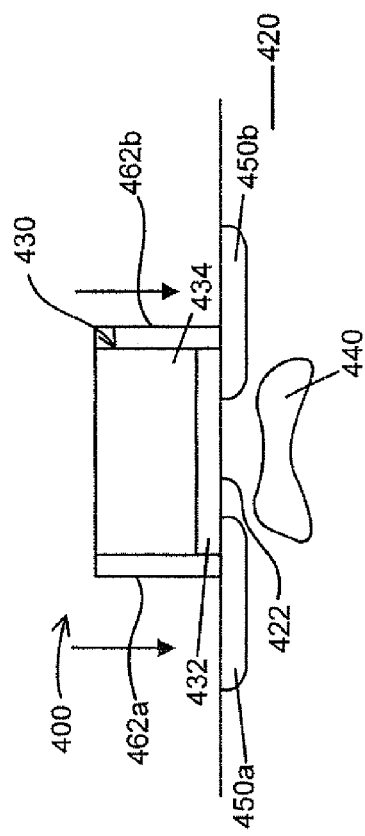

After offset spacer process, a self-aligning source/drain extension ion implantation process is performed, as illustrated in FIG. 4C, to form self-aligned shallow source/drain extensions 450a, 450b in the substrate 420. The source/drain extension implantation process may be performed with without an ion beam tilt-angle, and preferably with a beam tilt angle up to about 50 degrees. An ultra-shallow junction may be achieved by using a beam tilt angle at the high end of the above beam tilt angle range. The source/drain extension implantation process is performed with an implant dosage that is typically less than 2E16 cm−2 and an implant energy that is typically less than 200 kev. The dopant used may include, for example, As, P, $BF_2$, In Sb, and B.

Figure 4D:
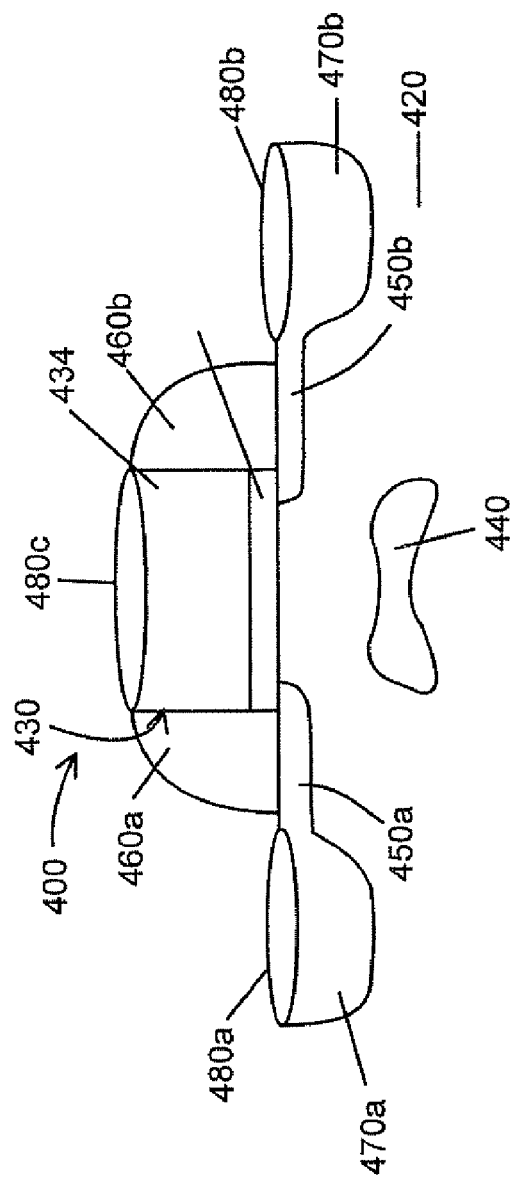

As illustrated in FIG. 4D, the transistor 400 may be completed by forming first and second non-conductive spacers 460a, 460b along opposing side walls of the gate structure 430, self-aligned first and second source/drain regions 470a, 470b in the substrate 420 which contact the source/drain extensions 450a, 450b, and forming conductive silicide films 480a, 480b, 480c over the gate conductor 434 and the source/drain regions 270a, 270b. The spacers 460a, 460b may be formed as single or multilayer structure using a conventional spacer forming method. The source/drain regions 470a, 470b may be formed using conventional source/drain implantation and anneal processes. The silicide films 480a, 480b, 480c may be formed using a conventional silicidation process.

CMOS devices fabricated in accordance with the above methods exhibit improved short channel effects and low leakage currents. More specifically, the shallow and lightly doped source/drain extensions minimize the short channel behavior as the CMOS devices are scaled down. In addition, the implant pocket region or regions reduce the leakage current of the CMOS device.

Figure 5A:
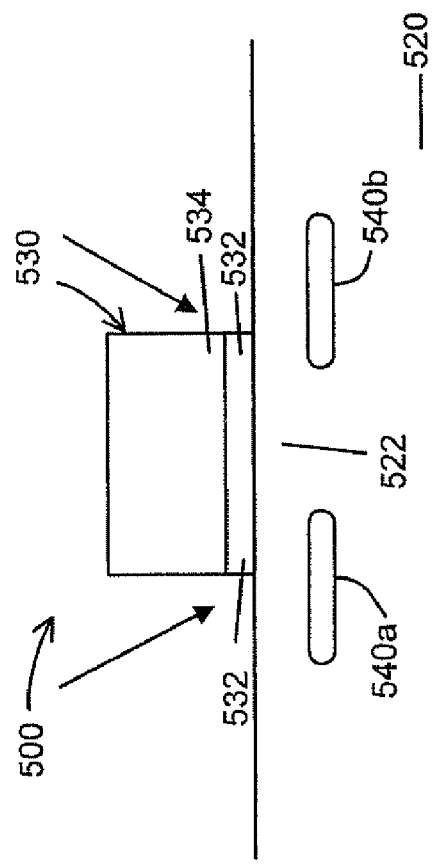

FIGS. 5A-5E are sectional views illustrating yet another method of fabricating a scaled down transistor 500 (e.g. PMOS or NMOS) of a high performance CMOS device according to the present invention. The method starts with a substrate 520 similar to the one described above with reference to FIG. 1A. Then, as illustrated in FIG. 5A, a self-aligning pocket ion implantation process is performed. The pocket ion implantation process forms regions 540a, 540b in the substrate 520 at the opposite ends of channel region 522. The pocket ion implantation process may be performed in the same manner as described earlier, i.e., with an ion beam tilt angle that may be up to 50 degrees or without an ion beam tilt-angle. The pocket implantation is performed with an implant dosage that is typically less than 2E15 cm−2 and an implant energy that is typically less than 200 kev. The dopant used may include, for example, As, P, $BF_2$, In Sb, and B.

Figure 5B:
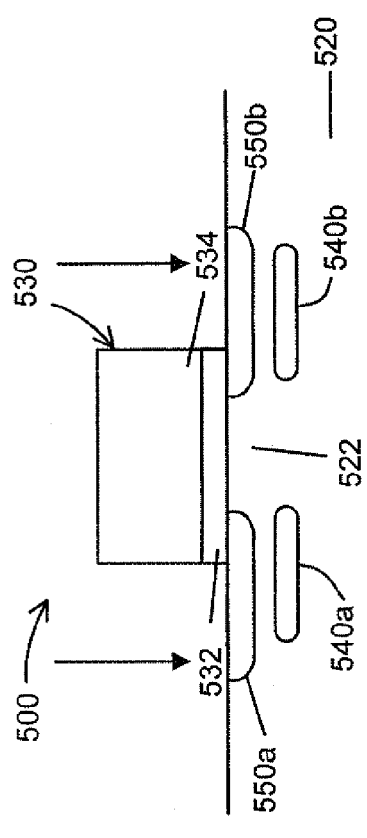

As illustrated in FIG. 5B, a self-aligning source/drain extension ion implantation process is performed, which forms self-aligned shallow source/drain extensions 550a, 550b in the substrate 520. The source/drain extension implantation process may be performed with a beam tilt angle up to about 50 degrees or without an ion beam tilt-angle. The source/drain extension implantation is performed with an implant dosage that is typically less than 2E16 cm−2 and an implant energy that is typically less than 200 kev. The dopant used may include, for example, As, P, $BF_2$, In Sb, and B.

Figure 5C:
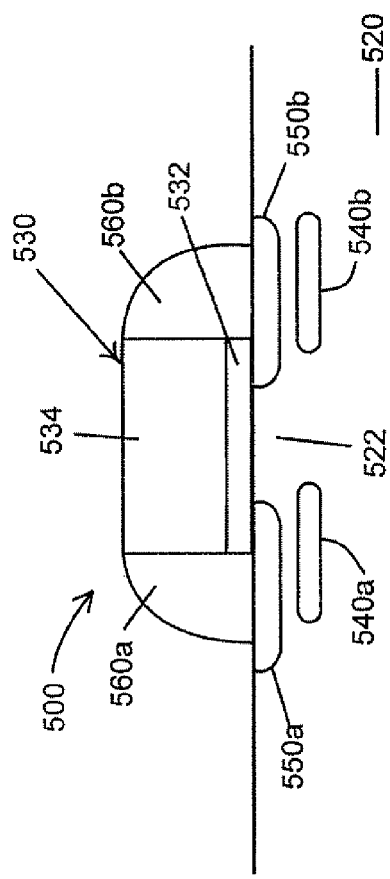

First and second non-conductive spacers 560a, 560b are then formed along opposing side walls of the gate structure 530 as illustrated in FIG. 5C. The spacers 560a, 560b may be formed as single or multilayer structure using, for example, a conventional spacer forming method.

As illustrated in FIG. 5D, first and second source/drain regions 570a, 570b are formed in the substrate 520 using a "smart" grading source/drain implantation process. The smart grading implantation process comprises a high-energy, low-dose source/drain implant followed by a high-dose source/drain implant.

The high-energy, low-dose source/drain implant may be performed with a beam tilt angle up to about 50 degrees. The implant energy is typically less than 150 kev and the implant dosage is typically less than 1E15 cm−2. The dopant used may include, for example, As, P, $BF_2$, In Sb, and B.

The high-dose source/drain implant may be performed with a beam tilt angle up to about 50 degrees. The implant energy is typically greater than 1 kev and the implant dosage is typically greater than 1E14 cm−2. The dopant used may include, for example, As, P, $BF_2$, In Sb, and B.

After completion of the smart grading source/drain implantation process, a silicidation process may be performed to form conductive silicide films 580a, 580b, 580c over the gate conductor 534 and source/drain regions 570a, 570b, as illustrated in FIG. 5E. CMOS devices fabricated using the smart grading source/drain implantation process exhibit improved short channel effects and low leakage currents.

While the foregoing invention has been described with reference to the above, various modifications and changes can be made without departing from the spirit of the invention. Accordingly, all such modifications and changes are considered to be within the scope of the appended claims.

What is claimed is:

1. A method of manufacturing an integrated circuit, the method comprising the steps of:
    forming a gate structure over a substrate;
    forming source/drain extensions in the substrate;
    performing a thermal cycle process for solid phase epitaxy on the substrate at an ultra-low temperature between about 350° C. and about 800° C., to activate dopants in the source/drain extensions;
    forming spacers along sides of the gate structure after the step of performing a thermal cycle process for solid phase epitaxy on the substrate; and
    thermal annealing the substrate at a temperature is between about 700° C. and about 1050° C.

2. The method according to claim 1, further comprising the step of forming pocket implant regions in the substrate.

3. The method according to claim 2, further comprising the step of thermal annealing the substrate.

4. A method of manufacturing an integrated circuit, the method comprising the steps of:
    forming a gate structure over a substrate;
    forming source/drain extensions in the substrate;
    performing a thermal cycle process for solid phase epitaxy on the substrate at an ultra-low temperature between about 350° C. and about 800° C.;
    forming spacers along sides of the gate structure after the step of performing a thermal cycle process for solid phase epitaxy on the substrate; and
    forming pocket implant regions in the substrate;
    thermal annealing the substrate at a temperature between about 700° C. and about 1050° C.

5. The method according to claim 2, wherein the step of forming pocket implant regions in the substrate is performed prior to the step of forming source/drain extensions in the substrate.

6. A method of manufacturing an integrated circuit, the method comprising the steps of:
    forming a gate structure over a substrate;
    forming source/drain extensions in the substrate;
    performing a thermal cycle process for solid phase epitaxy on the substrate at an ultra-low temperature between about 350° C. and about 800° C.;
    forming spacers along sides of the gate structure after the step of performing a thermal cycle process for solid phase epitaxy on the substrate;
    forming pocket implant regions in the substrate; and
    thermal annealing the substrate; wherein the thermal annealing step is performed after the step of forming the pocket implant regions and before the step of forming the source/drain extensions, and
    thermal annealing step the substrate at a temperature between about 700° C. and about 1050° C.

* * * * *